(12) United States Patent
Hirose et al.

(10) Patent No.: US 11,758,813 B2
(45) Date of Patent: Sep. 12, 2023

(54) THERMOELECTRIC CONVERSION MATERIAL, THERMOELECTRIC CONVERSION ELEMENT, THERMOELECTRIC CONVERSION MODULE, OPTICAL SENSOR, AND METHOD FOR MANUFACTURING THERMOELECTRIC CONVERSION MATERIAL

(71) Applicants: SUMITOMO ELECTRIC INDUSTRIES, LTD., Osaka (JP); TOYOTA SCHOOL FOUNDATION, Nagoya (JP)

(72) Inventors: Kotaro Hirose, Osaka (JP); Masahiro Adachi, Osaka (JP); Takashi Matsuura, Saka (JP); Yoshiyuki Yamamoto, Osaka (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 95 days.

(21) Appl. No.: 16/973,194

(22) PCT Filed: Mar. 26, 2019

(86) PCT No.: PCT/JP2019/012835
§ 371 (c)(1),
(2) Date: Dec. 8, 2020

(87) PCT Pub. No.: WO2019/244428
PCT Pub. Date: Dec. 26, 2019

(65) Prior Publication Data
US 2021/0265550 A1 Aug. 26, 2021

(30) Foreign Application Priority Data
Jun. 18, 2018 (JP) .............................. JP2018-115276

(51) Int. Cl.
| | | |
|---|---|---|
| H10N 10/855 | (2023.01) | |
| G01J 1/02 | (2006.01) | |
| H10N 10/01 | (2023.01) | |
| H10N 10/857 | (2023.01) | |

(52) U.S. Cl.
CPC .............. *H10N 10/855* (2023.02); *G01J 1/02* (2013.01); *H10N 10/01* (2023.02); *H10N 10/857* (2023.02)

(58) Field of Classification Search
CPC .... H10N 10/855; H10N 10/857; H10N 10/01; G01J 1/02
See application file for complete search history.

(56) References Cited

U.S. PATENT DOCUMENTS

2014/0191435 A1* 7/2014 Chen ....................... H01L 35/22
977/932
2016/0126440 A1 5/2016 Adachi et al.
(Continued)

FOREIGN PATENT DOCUMENTS

CN 1937272 A * 3/2007
JP 2008-523579 A 7/2008
(Continued)

OTHER PUBLICATIONS

Sharma, Temperature-dependent photoconductive properties of Ge-Sb-Te thin film, Phase Transitions 2019, vol. 92, No. 9, 851-861 (Year: 2019).*
(Continued)

*Primary Examiner* — Andrew J Golden
(74) *Attorney, Agent, or Firm* — Oliff PLC

(57) ABSTRACT

A thermoelectric conversion material is composed of a compound semiconductor including a plurality of base material elements, and includes: an amorphous phase; and crystal phases having an average grain size of more than or equal to 5 nm, each of the crystal phases being in a form of a grain.

(Continued)

The plurality of base material elements include a specific base material element that causes an increase of a band gap by increasing a concentration of the specific base material element. An atomic concentration of the specific base material element included in the crystal phases with respect to a whole of the plurality of base material elements included in the crystal phases is higher than an atomic concentration of the specific base material element included in the compound semiconductor with respect to a whole of the plurality of base material elements included in the compound semiconductor.

15 Claims, 7 Drawing Sheets

(56) References Cited

U.S. PATENT DOCUMENTS

| | | |
|---|---|---|
| 2018/0190891 A1* | 7/2018 | Adachi .................. H01L 35/22 |
| 2018/0212131 A1 | 7/2018 | Kikuchi et al. |
| 2019/0214538 A1 | 7/2019 | Adachi et al. |

FOREIGN PATENT DOCUMENTS

| | | | |
|---|---|---|---|
| WO | 2006/137923 A2 | 12/2006 | |
| WO | 2014/196475 A1 | 12/2014 | |
| WO | WO-2017002514 A1 * | 1/2017 | ............ H01L 35/22 |
| WO | 2017/057237 A1 | 4/2017 | |
| WO | 2018/043478 A1 | 3/2018 | |

OTHER PUBLICATIONS

CN-1937272-A English Machine Translation (Year: 2007).*

Hiroaki Takiguchi et al., "Nano Structural and Thermoelectric Properties of SiGeAu Thin Films", Japanese Journal of Applied Physics, 2011, 50, 041301.

Jun. 18, 2019 International Search Report issued in International Patent Application No. PCT/JP2019/012835.

Hiroaki Takiguchi et al., "Nano Structural and Thermoelectric Properties of SieGeAu Thin Films", Japanese Journal of Applied Physics, 2011, 50, 041301.

* cited by examiner ined herein
THERMOELECTRIC CONVERSION MATERIAL, THERMOELECTRIC CONVERSION ELEMENT, THERMOELECTRIC CONVERSION MODULE, OPTICAL SENSOR, AND METHOD FOR MANUFACTURING THERMOELECTRIC CONVERSION MATERIAL

TECHNICAL FIELD

The present disclosure relates to a thermoelectric conversion material, a thermoelectric conversion element, a thermoelectric conversion module, an optical sensor, and a method for manufacturing the thermoelectric conversion material. The present application claims a priority based on Japanese Patent Application No. 2018-115276 filed on Jun. 18, 2018, the entire content of which is incorporated herein by reference.

BACKGROUND ART

In recent years, renewable energy has been drawing attention as clean energy to replace a fossil fuel such as petroleum. Such renewable energy include energy obtained through power generation using solar light, hydraulic power, and wind power, as well as energy obtained through power generation involving thermoelectric conversion using a temperature difference. In the thermoelectric conversion, heat is directly converted into electric power. Hence, an unnecessary waste is not discharged during the conversion. Because the thermoelectric conversion requires no driving unit such as a motor, the thermoelectric conversion has a characteristic to facilitate maintenance of devices.

Efficiency η in converting a temperature difference (heat energy) into electric energy using a material (thermoelectric conversion material) for thermoelectric conversion is given by the following formula (1):

$$\eta = \Delta T/T_h \cdot (M-1)/(M+T_c/T_h) \quad (1)$$

where η represents conversion efficiency, $\Delta T$ represents a difference between $T_h$ and $T_c$, $T_h$ represents a temperature on the high temperature side, $T_c$ represents a temperature on the low temperature side, M equals to $(1+ZT)^{1/2}$, ZT equals to $\alpha^2 ST/K$, ZT represents a dimensionless figure of merit, $\alpha$ represents a Seebeck coefficient, S represents an electric conductivity, and $\kappa$ represents a thermal conductivity. The conversion efficiency is a monotonously increasing function of ZT. It is important to increase ZT in developing a thermoelectric conversion material.

For the thermoelectric conversion material, a technique has been reported in which Au nano particles are formed in SiGe (silicon germanium) by performing heat treatment onto a layered body obtained by layering Si, Ge, and Au (for example, Hiroaki Takiguchi et al., "Nano Structural and Thermoelectric Properties of SiGeAu Thin Films", Japanese Journal of Applied Physics 50 (2011) 041301 (NPL 1)).

WO 2014/196475 (PTL 1) discloses a thermoelectric conversion material including nano particles including a base material element and an element different from the base material element in a base material composed of a semiconductor material constituted of the base material element.

CITATION LIST

Patent Literature

PTL 1: WO 2014/196475

Non Patent Literature

NPL 1: Hiroaki Takiguchi et al., "Nano Structural and Thermoelectric Properties of SiGeAu Thin Films", Japanese Journal of Applied Physics 50 (2011) 041301

SUMMARY OF INVENTION

A thermoelectric conversion material according to the present disclosure is composed of a compound semiconductor including a plurality of base material elements, and includes: an amorphous phase; and crystal phases having an average grain size of more than or equal to 5 nm, each of the crystal phases being in a form of a grain. The plurality of base material elements include a specific base material element that causes an increase of a band gap by increasing a concentration of the specific base material element. An atomic concentration of the specific base material element included in the crystal phases with respect to a whole of the plurality of base material elements included in the crystal phases is higher than an atomic concentration of the specific base material element included in the compound semiconductor with respect to a whole of the plurality of base material elements included in the compound semiconductor. A difference is more than or equal to 3 at % between the atomic concentration of the specific base material element included in the compound semiconductor with respect to the whole of the plurality of base material elements included in the compound semiconductor and the atomic concentration of the specific base material element included in the crystal phases with respect to the whole of the plurality of base material elements included in the crystal phases.

DETAILED DESCRIPTION

Figure 1:
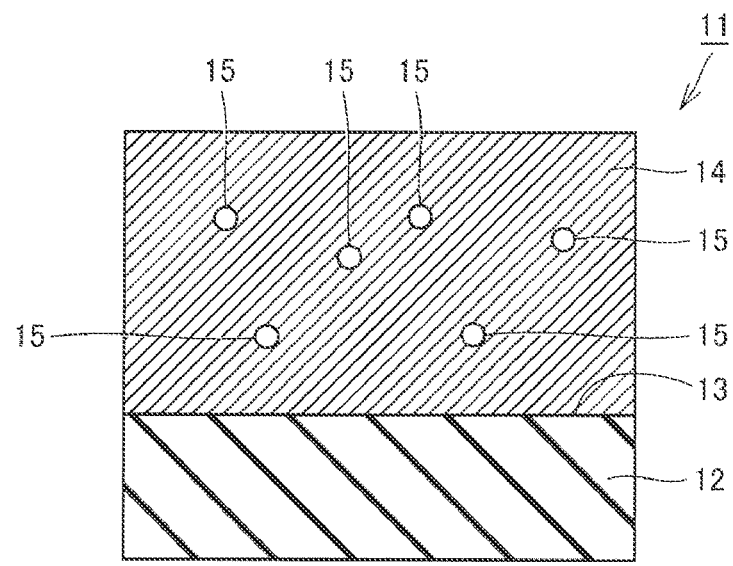
FIG. 1 is a schematic cross sectional view showing a portion of a thermoelectric conversion material according to a first embodiment of the present application.

Problems to be Solved by the Present Disclosure

There has been required a thermoelectric conversion material having conversion efficiency higher than those of the thermoelectric conversion materials disclosed in NPL 1 and PTL 1. When ZT can be increased, the efficiency of thermoelectric conversion can be improved. ZT can be increased by attaining high electric conductivity S.

Thus, it is one of objects to provide: a thermoelectric conversion material having improved efficiency of thermoelectric conversion by attaining high electric conductivity; a thermoelectric conversion element; a thermoelectric conversion module; an optical sensor; and a method for manufacturing the thermoelectric conversion material.

Advantageous Effect of the Present Disclosure

According to the above-described thermoelectric conversion material, the efficiency of thermoelectric conversion can be improved by attaining high electric conductivity.

Description of Embodiments

First, embodiments of the present disclosure are listed and described. A thermoelectric conversion material according to the present disclosure is composed of a compound semiconductor including a plurality of base material elements, and includes: an amorphous phase; and crystal phases having an average grain size of more than or equal to 5 nm, each of the crystal phases being in a form of a grain. The plurality of base material elements include a specific base material element that causes an increase of a band gap by increasing a concentration of the specific base material element. An atomic concentration of the specific base material element included in the crystal phases with respect to a whole of the plurality of base material elements included in the crystal phases is higher than an atomic concentration of the specific base material element included in the compound semiconductor with respect to a whole of the plurality of base material elements included in the compound semiconductor. A difference is more than or equal to 3 at % between the atomic concentration of the specific base material element included in the compound semiconductor with respect to the whole of the plurality of base material elements included in the compound semiconductor and the atomic concentration of the specific base material element included in the crystal phases with respect to the whole of the plurality of base material elements included in the crystal phases.

Since the average grain size of the crystal phases is more than or equal to 5 nm in the thermoelectric conversion material, the electric conductivity can be high. The atomic concentration of the specific base material element included in the crystal phases with respect to the whole of the plurality of base material elements included in the crystal phases is higher than the atomic concentration of the specific base material element included in the compound semiconductor with respect to the whole of the plurality of base material elements included in the compound semiconductor. The difference is more than or equal to 3 at % between the atomic concentration of the specific base material element included in the compound semiconductor with respect to the whole of the plurality of base material elements included in the compound semiconductor and the atomic concentration of the specific base material element included in the crystal phases with respect to the whole of the plurality of base material elements included in the crystal phases. Here, at % represents an atomic percent, i.e., a unit by which an atomic concentration is indicated in percentage. Thus, the band gap of the crystal phases can be made large to attain a small band offset, which is a difference in energy level from the amorphous phase, thus resulting in high electric conductivity. As a result, ZT can be increased to improve the efficiency of thermoelectric conversion. The average grain size of the crystal phases can be found in accordance with half widths in peaks of the crystal phases obtained by XRD (X-Ray Diffraction). It should be noted that in XRD, a below-described composition is determined based on the Vegard's law, which defines that a below-described lattice constant found from a result of measurement is changed linearly depending on a composition.

In the thermoelectric conversion material, the average grain size of the crystal phases may be less than or equal to 10 nm. In this way, ZT can be suppressed from being decreased due to an increase in thermal conductivity K.

In the thermoelectric conversion material, the difference may be less than or equal to 20 at % between the atomic concentration of the specific base material element included in the compound semiconductor with respect to the whole of the plurality of base material elements included in the compound semiconductor and the atomic concentration of the specific base material element included in the crystal phases with respect to the whole of the plurality of base material elements included in the crystal phases. In this way, ZT can be suppressed from being decreased due to a decrease in Seebeck coefficient $\alpha$.

In the thermoelectric conversion material, the specific base material element may be an element having a minimum lattice constant in the plurality of base material elements. With such an element having a small lattice constant, a potential barrier for carriers such as positive holes or electrons is high. When a large amount of such an element is included in the crystal phases, the band gap becomes large to result in a small band offset. Therefore, by attaining high electric conductivity, ZT can be increased.

In the thermoelectric conversion material, a ratio of the crystal phases in a whole of the compound semiconductor may be more than or equal to 20 volume % and less than or equal to 74 volume %. When the ratio of the crystal phases is more than or equal to 20 volume %, the grain size of each crystal phase can be facilitated to be more than or equal to 5 nm. Moreover, when the ratio of the crystal phases is less than or equal to 74 volume %, the crystal phases can be each facilitated to be in the form of a grain. It should be noted that the ratio of the crystal phases is preferably more than or equal to 30 volume %. In this way, ZT can be suppressed from being decreased due to a decrease in Seebeck coefficient $\alpha$. Moreover, the ratio of the crystal phases is preferably less than or equal to 50 volume %. In this way, ZT can be suppressed from being decreased due to an increase in thermal conductivity K. The volume ratio of the crystal phases can be found in the following manner. That is, the areas of the peaks of the crystal phases and the area of the peak of the amorphous phase are found in accordance with a spectrum obtained by performing measurement of Raman scattering. A ratio of the areas of the peaks of the crystal phases with respect to the total of the areas of the two types of obtained peaks is found as the volume ratio of the crystal phases.

In the thermoelectric conversion material, the specific base material element may be a group IV element. Here, the group IV element refers to a group IV element in the short form periodic table, and refers to a group 14 element in the long form periodic table, i.e., C (carbon), Si (silicon), Ge (germanium), Sn (tin), Pb (lead) or the like. Such a specific base material element is effectively used as a compound semiconductor suitable for the thermoelectric conversion material.

In the thermoelectric conversion material, the compound semiconductor may be a SiGe-based material. The SiGe-based material is particularly suitable as a semiconductor material for the thermoelectric conversion material. The SiGe-based material refers to SiGe and a material in which part of at least one of Si and Ge is substituted by a different element in SiGe with a content ratio of the total amount of Si and Ge being more than or equal to 80 at % therein.

In the thermoelectric conversion material, the compound semiconductor may further include at least one of a first additional element that forms an energy level in the band gap and a second additional element that brings a Fermi level close to a conduction band or a valence band. The first additional element serves to form an energy level in the band gap to attain high electric conductivity, with the result that ZT can be increased. The second additional element serves to bring the Fermi level close to the conduction band or the valence band to attain high electric conductivity, with the result that ZT can be increased.

In the thermoelectric conversion material, the first additional element may be one or more materials selected from a group consisting of Au, Cu, and Fe. Since such a first additional element forms the energy level in the band gap, high electric conductivity is attained, with the result that ZT can be increased.

In the thermoelectric conversion material, the second additional element may be at least one of B and P. Since such a second additional element serves to bring the Fermi level close to the conduction band or the valence band, high electric conductivity is attained, with the result that ZT can be increased.

A thermoelectric conversion element according to the present application includes: a thermoelectric conversion material portion; a first electrode disposed in contact with the thermoelectric conversion material portion; and a second electrode disposed in contact with the thermoelectric conversion material portion and disposed to be separated from the first electrode. The thermoelectric conversion material portion is composed of the thermoelectric conversion material of the present application having a component composition adjusted to have p type or n type conductivity.

In the thermoelectric conversion element of the present application, the thermoelectric conversion material portion is composed of the thermoelectric conversion material that has a component composition adjusted to have p type or n type conductivity and that is excellent in thermoelectric conversion characteristics. Accordingly, there can be provided a thermoelectric conversion element excellent in conversion efficiency.

A thermoelectric conversion module according to the present application includes the thermoelectric conversion element. According to the thermoelectric conversion module of the present application, since the thermoelectric conversion element of the present application excellent in the efficiency of thermoelectric conversion is included, there can be obtained a thermoelectric conversion module having improved efficiency of thermoelectric conversion.

An optical sensor according to the present application includes: an absorber that absorbs optical energy; and a thermoelectric conversion material portion connected to the absorber. The thermoelectric conversion material portion is composed of the thermoelectric conversion material of the present application having a component composition adjusted to have p type or n type conductivity.

In the optical sensor of the present application, the thermoelectric conversion material portion is composed of the thermoelectric conversion material that has a component composition adjusted to have p type or n type conductivity and that is excellent in thermoelectric conversion characteristics. Accordingly, an optical sensor having high sensitivity can be provided.

A method for manufacturing a thermoelectric conversion material according to the present application includes: preparing a substrate having a main surface; forming an amorphous phase composed of a compound semiconductor by providing a plurality of base material elements on the main surface through vapor deposition with the main surface having a temperature of less than or equal to 200 K; and forming crystal phases in the amorphous phase by heating the amorphous phase, the crystal phases having an average grain size of more than or equal to 5 nm, each of the crystal phases being in a form of a grain.

According to such a method for manufacturing the thermoelectric conversion material, since the temperature of the main surface is less than or equal to 200 K when forming the amorphous phase, the atomic concentration of the specific base material element included in the crystal phases with respect to the whole of the plurality of base material elements included in the crystal phases can be facilitated to be higher than the atomic concentration of the specific base material element included in the compound semiconductor with respect to the whole of the plurality of base material elements included in the compound semiconductor, and the difference can be facilitated to be more than or equal to 3 at % between the atomic concentration of the specific base material element included in the compound semiconductor with respect to the whole of the plurality of base material elements included in the compound semiconductor and the atomic concentration of the specific base material element included in the crystal phases with respect to the whole of the plurality of base material elements included in the crystal phases. As a result, electric conductivity can be high. Moreover, since the crystal phases having an average grain size of more than or equal to 5 nm and each in the form of a grain are formed, electric conductivity can be high. Therefore, according to the method for manufacturing the thermoelectric conversion material in the present application, there can be efficiently manufactured a thermoelectric conversion material having improved thermoelectric efficiency by increasing electric conductivity to increase ZT.

Details of Embodiments of the Present Disclosure

Next, one embodiment of a thermoelectric conversion material of the present disclosure will be described with reference to figures. In the below-described figures, the same or corresponding portions are given the same reference characters and are not described repeatedly.

First Embodiment

The following describes a configuration of a thermoelectric conversion material according to a first embodiment of the present application. FIG. 1 is a schematic cross sectional view showing a portion of the thermoelectric conversion material according to the first embodiment of the present application. With reference to FIG. 1, thermoelectric conversion material 11 according to the first embodiment of the present application is disposed on a substrate, specifically, a main surface 13 of a sapphire substrate 12, for example. Thermoelectric conversion material 11 is composed of a compound semiconductor including a plurality of base material elements. The plurality of base material elements included in the compound semiconductor include Si and Ge.

In the present embodiment, the compound semiconductor is a SiGe-based material. In the first embodiment, Si serving as a base material element is a specific base material element that causes increase of a band gap by increasing the concentration of Si. It should be noted that the compound semiconductor includes Au as a first additional element that forms a new level. In the present embodiment, the base material elements are Si and Ge and the first additional element is Au. No second additional element is included.

Thermoelectric conversion material 11 includes an amorphous phase 14 and crystal phases 15. The plurality of crystal phases 15 included in thermoelectric conversion material 11 are each in the form of a grain. Each of crystal phases 15 is a precipitated phase in which Au, which is the first additional element, serves as a crystal nucleus. Crystal phases 15 are dispersed in amorphous phase 14. Crystal phases 15 exist in the state of microcrystals dispersed in amorphous phase 14. With Au, an energy level in the band gap can be formed.

The average grain size of crystal phases 15 is more than or equal to 5 nm. Preferably, the average grain size of crystal phases 15 is more than or equal to 6 nm. It should be noted that the average grain size of crystal phases 15 is less than or equal to 10 nm. In this way, ZT can be suppressed from being decreased due to an increase in thermal conductivity K. Preferably, the average grain size of crystal phases 15 is less than or equal to 7 nm. Moreover, the atomic concentration of Si included in crystal phases 15 with respect to the whole of Si and Ge included in crystal phases 15 is higher than the atomic concentration of Si included in the compound semiconductor with respect to the whole of Si and Ge included in the compound semiconductor. A difference is more than or equal to 3 at % between the atomic concentration of Si included in the compound semiconductor with respect to the whole of Si and Ge included in the compound semiconductor and the atomic concentration of Si included in crystal phases 15 with respect to the whole of Si and Ge included in crystal phases 15. In this way, the band gap of crystal phases 15 can be made large to attain a small band offset, which is a difference in energy level from the amorphous phase, thus resulting in high electric conductivity. As a result, ZT can be increased to improve the efficiency of thermoelectric conversion. This will be described later. Preferably, the difference is more than or equal to 4 at % between the atomic concentration of Si included in the compound semiconductor with respect to the whole of Si and Ge included in the compound semiconductor and the atomic concentration of Si included in crystal phases 15 with respect to the whole of Si and Ge included in crystal phases 15. It should be noted that when the difference is less than or equal to 20 at % between the atomic concentration of Si included in the compound semiconductor with respect to the whole of Si and Ge included in the compound semiconductor and the atomic concentration of Si included in crystal phases 15 with respect to the whole of Si and Ge included in crystal phases 15, ZT can be suppressed from being decreased due to a decrease in Seebeck coefficient α. More preferably, the difference is less than or equal to 13 at % between the atomic concentration of Si included in the compound semiconductor with respect to the whole of Si and Ge included in the compound semiconductor and the atomic concentration of Si included in crystal phases 15 with respect to the whole of Si and Ge included in crystal phases 15.

Figure 2:
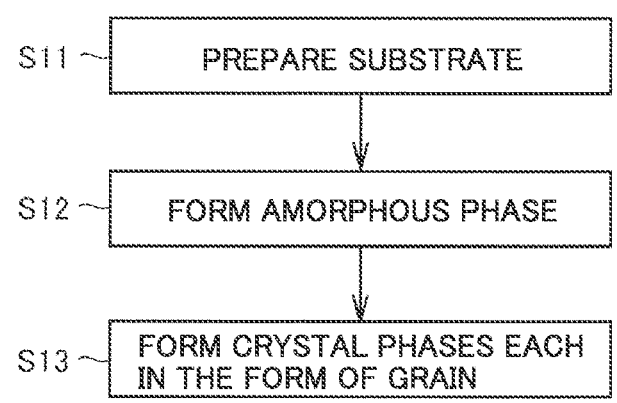
FIG. 2 is a flowchart showing representative steps of a method for manufacturing the thermoelectric conversion material according to the first embodiment.

Next, a method for manufacturing thermoelectric conversion material 11 according to the first embodiment will be described. FIG. 2 is a flowchart showing representative steps of the method for manufacturing the thermoelectric conversion material according to the first embodiment. With reference to FIG. 2, a substrate having a main surface is prepared (step S11 in FIG. 2; hereinafter, the term "step" will be omitted). In this case, for example, sapphire substrate 12 having main surface 13 is prepared as the substrate serving as a base. Next, an amorphous phase composed of a compound semiconductor is formed by providing a plurality of base material elements on the main surface through vapor deposition with main surface 13 having a temperature of less than or equal to 200 K (S12). In this case, for example, an MBE (Molecular Beam Epitaxy) method is employed to apply the material elements onto main surface 13 until a predetermined thickness is achieved. Next, crystal phases are formed in the amorphous phase by heating the amorphous phase, the crystal phases having an average grain size of more than or equal to 5 nm, each of the crystal phases being in the form of a grain (S13). In this case, for example, the formation of the crystal phases is performed by heating sapphire substrate 12 to a predetermined temperature and maintaining the temperature for a predetermined period of time. In this way, the thermoelectric conversion material according to the first embodiment is obtained.

As a specific example, in S12, Si, Ge, and Au are simultaneously applied onto main surface 13 at respective rates of 1 nm/minute, 1 nm/minute, and 0.1 nm/minute, for example. Film formation is performed by providing an amorphous phase having a total thickness of more than or equal to 200 nm on main surface 13 of sapphire substrate 12 through vapor deposition. In S13, heat treatment is performed in such a manner that the obtained product is heated to, for example, 500° C. and is maintained for 15 minutes.

Characteristics of each of samples of thermoelectric conversion material 11 produced on the above-described conditions were examined. Thermoelectric characteristics were measured using a thermoelectric characteristic measurement device (RZ2001i provided by OZAWA SCIENCE). Moreover, the composition of thermoelectric conversion material 11 was found by XRD (X-Ray Diffraction) and EDX (Energy Dispersive X-ray spectrometry). Regarding XRD, in accordance with the half widths of the peaks of the crystallized portions of thermoelectric conversion material 11, i.e., crystal phases 15, the atomic concentration of Si in crystal phases 15 was found. Regarding EDX, in accordance with the respective half widths of the peaks of crystal phases 15 and amorphous phase 14, the atomic concentration of Si in the whole of the compound semiconductor was found.

Figure 3:
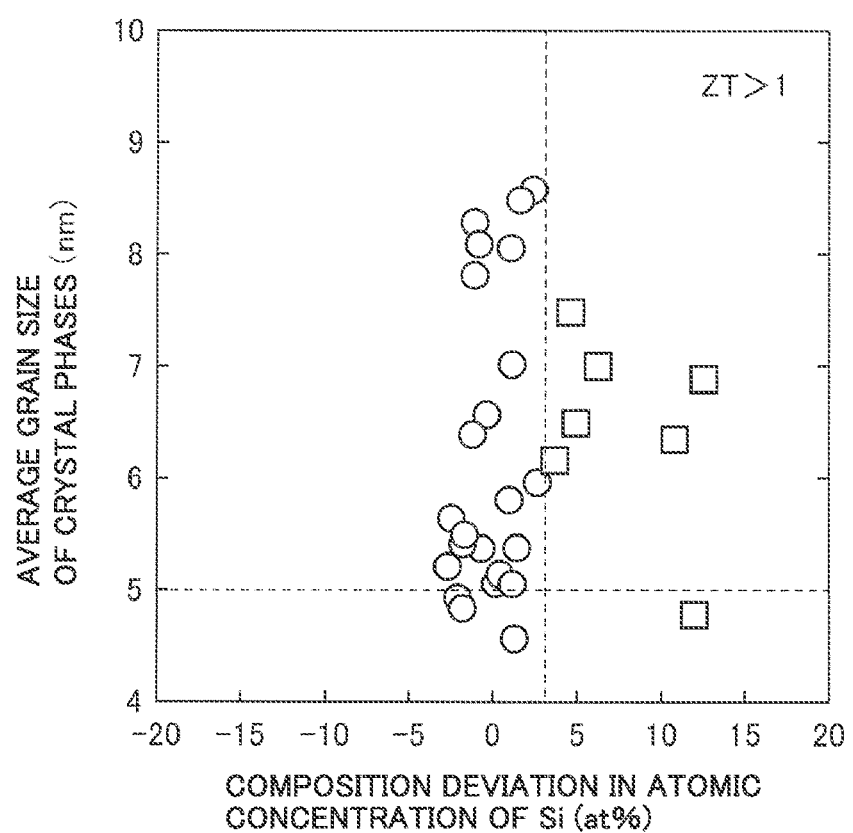
FIG. 3 is a graph showing a relation between a value of ZT and each of a composition deviation in an atomic concentration of Si and the average grain size of crystal phases.
Figure 4:
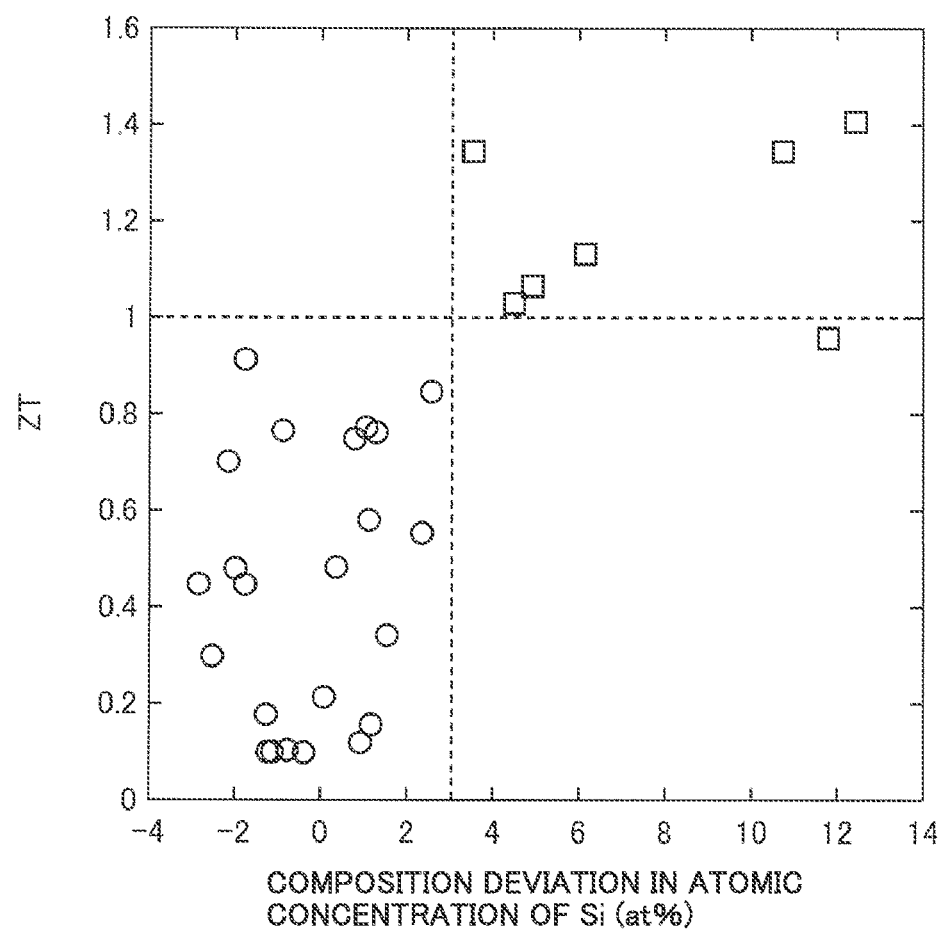
FIG. 4 is a graph showing a relation between the composition deviation in the atomic concentration of Si and the value of ZT.

FIG. 3 is a graph showing a relation between a value of ZT and each of a composition deviation in the atomic concentration of Si and the average grain size of the crystal phases. It should be noted that the term "composition deviation" refers to a difference between the atomic concentration of the specific base material element included in the compound semiconductor with respect to the whole of the plurality of base material elements included in the compound semiconductor and the atomic concentration of the specific base material element included in the crystal phases with respect to the whole of the plurality of base material elements included in the crystal phases. In FIG. 3, the horizontal axis represents the composition deviation (at %) in the atomic concentration of Si, and the vertical axis represents the average grain size (nm) of the crystal phases. In FIG. 3, each of white quadrangular marks represents a case where the production was performed with main surface 13 having a temperature of less than or equal to 200 K, and each of white circle marks represents a case where the production was performed with main surface 13 having a temperature of more than 200 K. The value of ZT is larger than 1 when the composition deviation is more than or equal to 3 at % and the average grain size of the crystal phases falls within a range of more than or equal to 5 nm. FIG. 4 is a graph showing a relation between the composition deviation in the atomic concentration of Si and the value of ZT. In FIG. 4, the horizontal axis represents the composition deviation (at %) in the atomic concentration of Si, and the vertical axis represents the value of ZT in thermoelectric conversion material 11.

Here, the composition deviation in the atomic concentration of Si is defined as follows: $Si_{XRD}/(Si_{XRD}+Ge_{XRD}) - Si_{EDX}/(Si_{EDX}+Ge_{EDX})$. $Si_{XRD}$ represents the atomic concentration of Si found by XRD. $Ge_{XRD}$ represents the atomic concentration of Ge found by XRD. $Si_{EDX}$ represents the atomic concentration of Si found by EDX. $Ge_{EDX}$ represents the atomic concentration of Ge found by EDX. From $Si_{XRD}/(Si_{XRD}+Ge_{XRD})$, the atomic concentration of Si, which is the specific base material element included in crystal phases 15, with respect to the whole of Si and Ge, which are the plurality of base material elements included in crystal phases 15, is found. From $Si_{EDX}/(Si_{EDX}+Ge_{EDX})$, the atomic concentration of Si, which is the specific base material element included in the compound semiconductor, with respect to the whole of Si and Ge, which are the plurality of base material elements included in the compound semiconductor, is found. It should be noted that Au, which is the first additional element, is not included in the denominators in the above-described formula.

With reference to FIG. 3 and FIG. 4, the value of ZT can be larger than 1 when the average grain size of crystal phases 15 is more than or equal to 5 nm and the composition deviation in the atomic concentration of Si is more than or equal to 3 at %. Therefore, such a thermoelectric conversion material 11 can provide improved efficiency in thermoelectric conversion.

Figure 5:
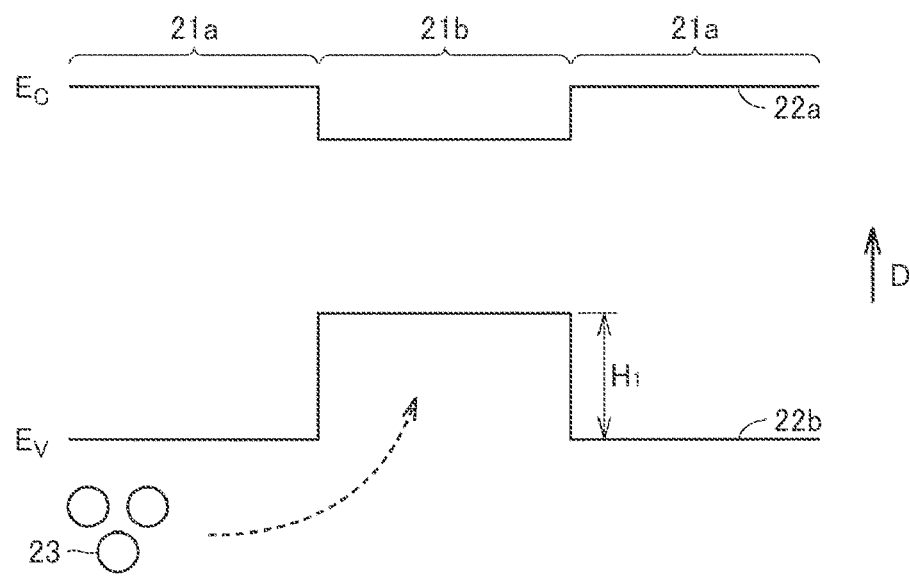
FIG. 5 shows a band structure when the composition deviation in the atomic concentration of Si is less than 3 at %.
Figure 6:
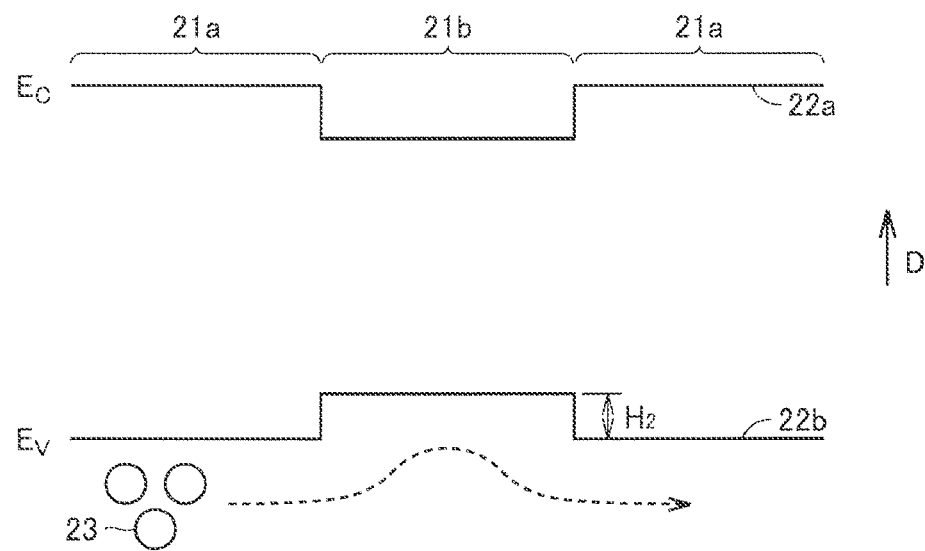
FIG. 6 shows a band structure when the composition deviation in the atomic concentration of Si is more than or equal to 3 at %.

Here, the following describes a reason why thermoelectric conversion material 11 according to the first embodiment has excellent thermoelectric characteristics. FIG. 5 shows a band structure when the composition deviation in the atomic concentration of Si is less than 3 at %. FIG. 6 shows a band structure when the composition deviation in the atomic concentration of Si is more than or equal to 3 at %. FIG. 5 and FIG. 6 show an energy level Ec22a of a conduction band and an energy level Ev22b of a valence band in a region 21a corresponding to amorphous phase 14 and in a region 21b corresponding to crystal phase 15. In each of FIG. 5 and FIG. 6, energy becomes higher in a direction indicated by an arrow D. With reference to FIG. 5 and FIG. 6, the band gap in region 21b corresponding to crystal phase 15 is smaller than the band gap of region 21a corresponding to amorphous phase 14. Here, with reference to FIG. 5, when the composition deviation in the atomic concentration of Si is less than 3 at %, a band offset $H_1$ becomes large. Band offset $H_1$ is a difference in energy level from amorphous phase 14 on the valence band side. Accordingly, positive holes 23 are caught as indicated by a broken line arrow and are less likely to be moved, with the result that electric conductivity becomes low. On the other hand, with reference to FIG. 6, when the composition deviation in Si is more than or equal to 3 at %, a band offset $H_2$ becomes smaller than band offset $H_1$. Band offset $H_2$ is a difference in energy level from amorphous phase 14 on the valence band side. Accordingly, positive holes 23 are more likely to be moved freely in the valence band as indicated by a broken line arrow, with the result that electric conductivity can become high. As a result, ZT can be increased.

It should be noted that in thermoelectric conversion material 11, the ratio of crystal phases 15 in the whole of the compound semiconductor may fall within the range of more than or equal to 20 volume % and less than or equal to 74 volume %. When the ratio of crystal phases 15 is more than or equal to 20 volume %, the grain sizes of crystal phases 15 can be facilitated to be more than or equal to 5 nm. Moreover, when the ratio of crystal phases 15 is less than or equal to 74 volume %, crystal phases 15 are each facilitated to be in the form of grains. It should be noted that the ratio of crystal phases 15 is more preferably more than or equal to 30 volume % and less than or equal to 50 volume %.

In thermoelectric conversion material 11, the specific base material element may be a group IV element. Such a specific base material element is effectively used as a compound semiconductor suitable for thermoelectric conversion material 11.

In thermoelectric conversion material 11, the compound semiconductor is a SiGe-based material, but it is not limited thereto. The compound semiconductor may be a different compound semiconductor. Specifically, the compound semiconductor may be AlMnSi, MnSi, SnSe, or $Cu_2Se$, for example.

In thermoelectric conversion material 11, the compound semiconductor includes Au as the first additional element, but it is not limited thereto. The first additional element may be one or more materials selected from a group consisting of Au, Cu, and Fe. Since such a first additional element forms the energy level in the band gap, high electric conductivity is attained, with the result that ZT can be increased.

Moreover, thermoelectric conversion material 11 may include the second additional element that brings the Fermi level close to the conduction band or the valence band. That is, thermoelectric conversion material 11 may further include at least one of the first additional element that forms the energy level in the band gap and the second additional element that brings the Fermi level close to the conduction band or the valence band. Since the energy level in the band gap is formed by such a first additional element, high electric conductivity is attained, with the result that ZT can be increased. Since the Fermi level is brought close to the conduction band or the valence band by such a second additional element, high electric conductivity is attained, with the result that ZT can be increased.

The second additional element may be one or more materials selected from a group consisting of B and P. Since such a second additional element brings the Fermi level close to the conduction band or the valence band, high electric conductivity is attained, with the result that ZT can be increased.

Second Embodiment

Next, the following describes a power generation element and a power generation module as respective embodiments of a thermoelectric conversion element and a thermoelectric conversion module, each of which employs the thermoelectric conversion material according to the first embodiment of the present application.

Figure 7:
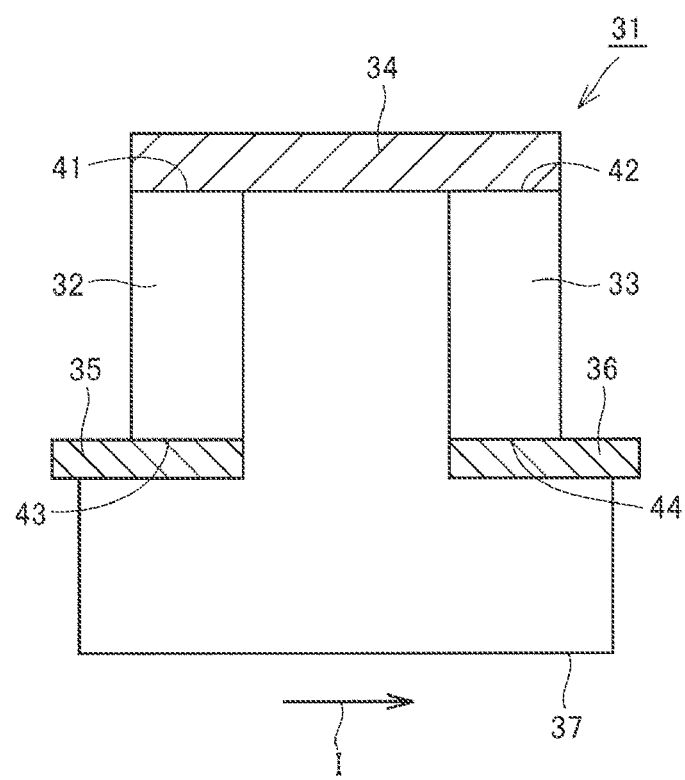
FIG. 7 is a schematic view showing a structure of a π type thermoelectric conversion element (power generation element) serving as a thermoelectric conversion element in a second embodiment.

FIG. 7 is a schematic view showing a structure of a π type thermoelectric conversion element (power generation element) 31 serving as a thermoelectric conversion element in a second embodiment. With reference to FIG. 7, π type thermoelectric conversion element 31 includes: a p type thermoelectric conversion material portion 32 serving as a first thermoelectric conversion material portion; an n type thermoelectric conversion material portion 33 serving as a second thermoelectric conversion material portion; a high temperature side electrode 34; a first low temperature side electrode 35; a second low temperature side electrode 36; and a wiring 37.

P type thermoelectric conversion material portion 32 is composed of the thermoelectric conversion material of the first embodiment having a component composition adjusted to have p type conductivity, for example. P type thermoelectric conversion material portion 32 has p type conductivity because the thermoelectric conversion material of the first embodiment constituting p type thermoelectric conversion material portion 32 is doped with a p type impurity for generating p type carriers (positive holes), which are majority carriers, for example.

N type thermoelectric conversion material portion 33 is composed of the thermoelectric conversion material of the first embodiment having a component composition adjusted to have n type conductivity, for example. N type thermoelectric conversion material portion 33 has n type conductivity because the thermoelectric conversion material of the first embodiment constituting n type thermoelectric conversion material portion 33 is doped with an n type impurity for generating n type carriers (electrons), which are majority carriers, for example.

P type thermoelectric conversion material portion 32 and n type thermoelectric conversion material portion 33 are disposed side by side with a space being interposed therebetween. High temperature side electrode 34 is disposed to extend from one end portion 41 of p type thermoelectric conversion material portion 32 to one end portion 42 of n type thermoelectric conversion material portion 33. High temperature side electrode 34 is disposed in contact with both one end portion 41 of p type thermoelectric conversion material portion 32 and one end portion 42 of n type thermoelectric conversion material portion 33. High temperature side electrode 34 is disposed to connect between one end portion 41 of p type thermoelectric conversion material portion 32 and one end portion 42 of n type thermoelectric conversion material portion 33. High temperature side electrode 34 is composed of an electrically conductive material such as a metal. High temperature side electrode 34 is in ohmic contact with p type thermoelectric conversion material portion 32 and n type thermoelectric conversion material portion 33.

Although thermoelectric conversion material portion 32 or thermoelectric conversion material portion 33 is desirably p type or n type, one of thermoelectric conversion material portion 32 and thermoelectric conversion material portion 33 may be a metal conductor wire.

First low temperature side electrode 35 is disposed in contact with the other end portion 43 of p type thermoelectric conversion material portion 32. First low temperature side electrode 35 is disposed to be separated from high temperature side electrode 34. First low temperature side electrode 35 is composed of an electrically conductive material such as a metal. First low temperature side electrode 35 is in ohmic contact with p type thermoelectric conversion material portion 32.

Second low temperature side electrode 36 is disposed in contact with the other end portion 44 of n type thermoelectric conversion material portion 33. Second low temperature side electrode 36 is disposed to be separated from high temperature side electrode 34 and first low temperature side electrode 35. Second low temperature side electrode 36 is composed of an electrically conductive material such as a metal. Second low temperature side electrode 36 is in ohmic contact with n type thermoelectric conversion material portion 33.

Wiring 37 is composed of an electric conductor such as a metal. Wiring 37 electrically connects between first low temperature side electrode 35 and second low temperature side electrode 36.

In π type thermoelectric conversion element 31, for example, when a temperature difference is formed to attain a high temperature on the side of one end portion 41 of p type thermoelectric conversion material portion 32 and one end portion 42 of n type thermoelectric conversion material portion 33 and a low temperature on the side of the other end portion 43 of p type thermoelectric conversion material portion 32 and the other end portion 44 of n type thermoelectric conversion material portion 33, p type carriers (positive holes) are moved from the one end portion 41 side toward the other end portion 43 side in p type thermoelectric conversion material portion 32. On this occasion, in n type thermoelectric conversion material portion 33, n type carriers (electrons) are moved from the one end portion 42 side toward the other end portion 44 side. As a result, current flows in wiring 37 in a direction of arrow I. In this way, power generation by thermoelectric conversion using the temperature difference is attained in π type thermoelectric conversion element 31. That is, π type thermoelectric conversion element 31 is a power generation element.

As the material for each of p type thermoelectric conversion material portion 32 and n type thermoelectric conversion material portion 33, thermoelectric conversion material 11 of the first embodiment is employed in which the value of ZT is increased by attaining a sufficiently high value of electric conductivity. As a result, π type thermoelectric conversion element 31 is a highly efficient power generation element.

In the above-described embodiment, the π type thermoelectric conversion element has been illustrated as an exemplary thermoelectric conversion element of the present application; however, the thermoelectric conversion element of the present application is not limited to this. The thermoelectric conversion element of the present application may be a thermoelectric conversion element having a different structure, such as an I type (single-leg type) thermoelectric conversion element.

By electrically connecting a plurality of π type thermoelectric conversion elements 31, a power generation module serving as a thermoelectric conversion module can be obtained. A power generation module 45, which is a thermoelectric conversion module of the present embodiment, has a structure in which a plurality of π type thermoelectric conversion elements 31 are connected in series.

Figure 8:
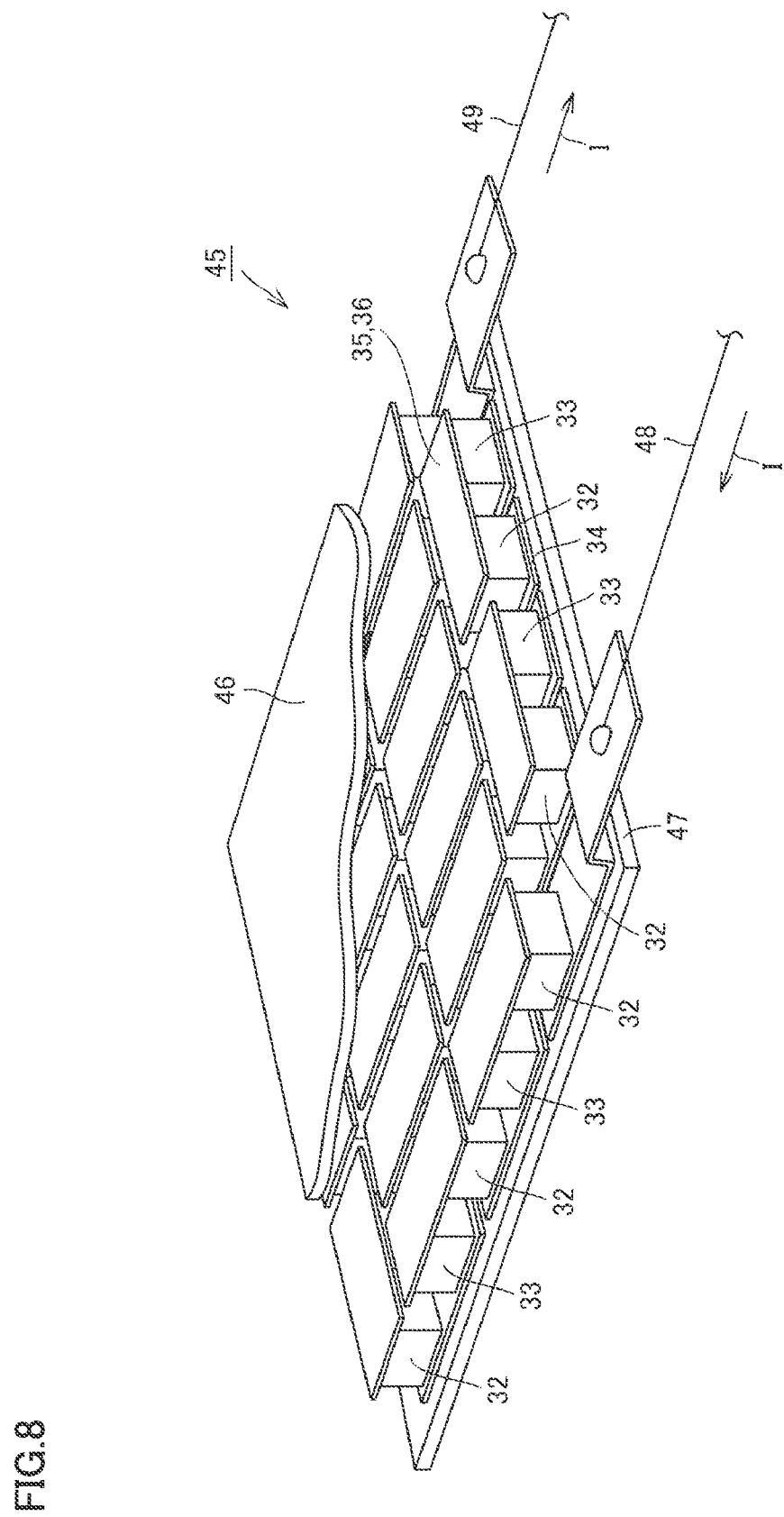
FIG. 8 shows an exemplary structure of a power generation module.

FIG. 8 shows an exemplary structure of power generation module 45. With reference to FIG. 8, power generation module 45 of the present embodiment includes: p type thermoelectric conversion material portions 32; n type thermoelectric conversion material portions 33; low temperature side electrodes 35, 36 corresponding to first low temperature side electrodes 35 and second low temperature side electrodes 36; high temperature side electrodes 34; a low temperature side insulator substrate 46; and a high temperature side insulator substrate 47. Each of low temperature side insulator substrate 46 and high temperature side insulator substrate 47 is composed of a ceramic such as alumina. P type thermoelectric conversion material portions 32 and n type thermoelectric conversion material portions 33 are alternately disposed side by side. As with π type thermoelectric conversion element 31 described above, low temperature side electrodes 35, 36 are disposed in contact with p type thermoelectric conversion material portion 32 and n type thermoelectric conversion material portion 33. As with π type thermoelectric conversion element 31 described above, high temperature side electrode 34 is disposed in contact with p type thermoelectric conversion material portion 32 and n type thermoelectric conversion material portion 33. Each p type thermoelectric conversion material portion 32 is connected to an adjacent n type thermoelectric conversion material portion 33 on one side by a common high temperature side electrode 34. Moreover, each p type thermoelectric conversion material portion 32 is connected to an adjacent n type thermoelectric conversion material portion 33 on a side different from the one side by common low temperature side electrodes 35, 36. In this way, all the p type thermoelectric conversion material portions 32 and n type thermoelectric conversion material portions 33 are connected in series.

Low temperature side insulator substrate 46 is disposed on the main surface side of each of low temperature side electrodes 35, 36 that are each in the form of a plate, the main surface side being opposite to the side thereof in contact with p type thermoelectric conversion material portion 32 and n type thermoelectric conversion material portion 33. One low temperature side insulator substrate 46 is disposed for the plurality of (all the) low temperature side electrodes 35, 36. High temperature side insulator substrate 47 is disposed on the side of each of high temperature side electrodes 34 that are each in the form of a plate, the side being opposite to the side thereof in contact with p type thermoelectric conversion material portion 32 and n type thermoelectric conversion material portion 33. One high temperature side insulator substrate 47 is disposed for the plurality of (all the) high temperature side electrodes 34.

Wirings 48, 49 are connected to high temperature side electrode 34 or low temperature side electrodes 35, 36 in contact with p type thermoelectric conversion material portion 32 or n type thermoelectric conversion material portion 33 located at respective ends among p type thermoelectric conversion material portions 32 and n type thermoelectric conversion material portion 33 connected in series. When a temperature difference is formed to attain a high temperature on the high temperature side insulator substrate 47 side and a low temperature on the low temperature side insulator substrate 46 side, current flows in a direction of arrow I by p type thermoelectric conversion material portions 32 and n type thermoelectric conversion material portions 33 connected in series, as with π type thermoelectric conversion element 31. In this way, power generation by thermoelectric conversion using the temperature difference is attained in power generation module 45.

Third Embodiment

Next, the following describes an infrared sensor, which is an optical sensor, as another embodiment of the thermoelectric conversion element employing the thermoelectric conversion material according to the first embodiment.

Figure 9:
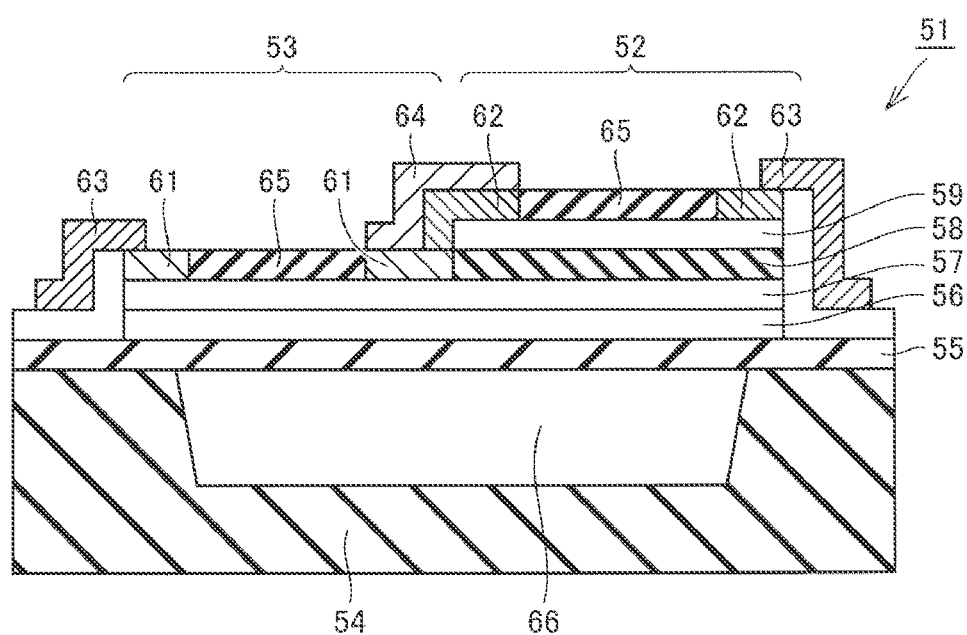
FIG. 9 shows an exemplary structure of an infrared sensor.

FIG. 9 shows an exemplary structure of an infrared sensor 51. With reference to FIG. 9, infrared sensor 51 includes a p type thermoelectric conversion portion 52 and an n type thermoelectric conversion portion 53 disposed adjacent to each other. P type thermoelectric conversion portion 52 and n type thermoelectric conversion portion 53 are formed on a substrate 54.

Infrared sensor 51 includes substrate 54, an etching stop layer 55, an n type thermoelectric conversion material layer 56, an n$^+$ type ohmic contact layer 57, an insulation layer 58, a p type thermoelectric conversion material layer 59, n side ohmic contact electrodes 61, p side ohmic contact electrodes 62, heat absorption pads 63, an absorber 64, and protective films 65.

Substrate 54 is composed of an insulator such as silicon dioxide. A recess 66 is formed in substrate 54. Etching stop layer 55 is formed to cover a surface of substrate 54. Etching stop layer 55 is composed of an insulator such as silicon nitride, for example. Recess 66 defines a clearance between etching stop layer 55 and substrate 54.

N type thermoelectric conversion material layer 56 is formed on a main surface of etching stop layer 55 opposite to substrate 54. N type thermoelectric conversion material layer 56 is composed of the thermoelectric conversion material of the first embodiment having a component composition adjusted to have n type conductivity, for example. N type thermoelectric conversion material layer 56 has n type conductivity because the thermoelectric conversion material of the first embodiment constituting n type thermoelectric conversion material layer 56 is doped with an n type impurity for generating n type carriers (electrons), which are majority carriers, for example. N$^+$ type ohmic contact layer 57 is formed on a main surface of n type thermoelectric conversion material layer 56 opposite to etching stop layer 55. For example, n$^+$ type ohmic contact layer 57 is doped with an n type impurity for generating n type carriers (electrons), which are majority carriers, at a higher concentration than that of n type thermoelectric conversion material layer 56. Accordingly, n$^+$ type ohmic contact layer 57 has n type conductivity.

N side ohmic contact electrode 61 is disposed in contact with the central portion of a main surface of n$^+$ type ohmic contact layer 57 opposite to n type thermoelectric conversion material layer 56. N side ohmic contact electrode 61 is composed of a material capable of ohmic contact with n$^+$ type ohmic contact layer 57, such as a metal. Insulation layer 58 composed of an insulator such as silicon dioxide is disposed on a main surface of n$^+$ type ohmic contact layer 57 opposite to n type thermoelectric conversion material layer 56. When seen from n side ohmic contact electrode 61, insulation layer 58 is disposed on the main surface of n$^+$ type ohmic contact layer 57 on the p type thermoelectric conversion portion 52 side.

Further, protective film 65 is disposed on a main surface of n$^+$ type ohmic contact layer 57 opposite to n type thermoelectric conversion material layer 56. When seen from n side ohmic contact electrode 61, protective film 65 is disposed on the main surface of n$^+$ type ohmic contact layer 57 opposite to p type thermoelectric conversion portion 52. On the main surface of n$^+$ type ohmic contact layer 57 opposite to n type thermoelectric conversion material layer 56, another n side ohmic contact electrode 61 is disposed opposite to the foregoing n side ohmic contact electrode 61 relative to protective film 65.

P type thermoelectric conversion material layer 59 is disposed on a main surface of insulation layer 58 opposite to n$^+$ type ohmic contact layer 57. P type thermoelectric conversion material layer 59 is composed of the thermoelectric conversion material of the first embodiment having a component composition adjusted to have p type conductivity, for example. P type thermoelectric conversion material layer 59 has p type conductivity because the thermoelectric conversion material of the first embodiment constituting p type thermoelectric conversion material layer 59 is doped with a p type impurity for generating p type carriers (positive holes), which are majority carriers, for example.

Protective film 65 is disposed at the central portion on the main surface of p type thermoelectric conversion material layer 59 opposite to insulation layer 58. The pair of p side ohmic contact electrodes 62, which sandwich protective film 65 therebetween, are disposed on the main surface of p type thermoelectric conversion material layer 59 opposite to insulation layer 58. Each of p side ohmic contact electrodes 62 is composed of a material capable of ohmic contact with p type thermoelectric conversion material layer 59, such as a metal. P side ohmic contact electrode 62 on the n type thermoelectric conversion portion 53 side in the pair of p side ohmic contact electrodes 62 is connected to n side ohmic contact electrode 61.

Absorber 64 is disposed to cover respective main surfaces of p side ohmic contact electrode 61 and n side ohmic contact electrode 62 opposite to $n^+$ type ohmic contact layer 57, p side ohmic contact electrode 61 and n side ohmic contact electrode 62 being connected to each other. Absorber 64 is composed of titanium, for example. Heat absorption pad 63 is disposed on and in contact with p side ohmic contact electrode 61 on the side not connected to n side ohmic contact electrode 62. Moreover, heat absorption pad 63 is disposed on and in contact with n side ohmic contact electrode 62 on the side not connected to p side ohmic contact electrode 61. As a material for heat absorption pad 63, Au (gold)/Ti (titanium) is employed, for example.

When infrared sensor 51 is irradiated with infrared rays, absorber 64 absorbs energy of the infrared rays. As a result, the temperature of absorber 64 is increased. On the other hand, the temperature of heat absorption pad 63 is suppressed from being increased. Accordingly, a temperature difference is formed between absorber 64 and heat absorption pad 63. Accordingly, in p type thermoelectric conversion material layer 59, p type carriers (positive holes) are moved from the absorber 64 side toward the heat absorption pad 63 side. On the other hand, in n type thermoelectric conversion material layer 56, n type carriers (electrons) are moved from the absorber 64 side toward the heat absorption pad 63 side. By drawing, from n side ohmic contact electrode 61 and p side ohmic contact electrode 62, current generated as a result of the movement of the carries, the infrared rays are detected.

As the material for each of p type thermoelectric conversion material layer 59 and n type thermoelectric conversion material layer 56, infrared sensor 51 of the present embodiment employs the thermoelectric conversion material of the first embodiment in which the value of ZT is increased by attaining a sufficiently high value of electric conductivity. As a result, infrared sensor 51 is an infrared sensor 51 having high sensitivity.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

11: thermoelectric conversion material; 12: sapphire substrate; 13: main surface; 14: amorphous phase; 15: crystal phase; 21a, 21b: region; 22a: energy level Ec; 22b: energy level Ev; 23: positive hole; 31: π type thermoelectric conversion element; 32: p type thermoelectric conversion material portion; 33: n type thermoelectric conversion material portion; 34: high temperature side electrode; 35: first low temperature side electrode (low temperature side electrode); 36: second low temperature side electrode (low temperature side electrode); 37, 48, 49: wiring; 41, 42, 43, 44: end portion; 45: power generation module; 46: low temperature side insulator substrate; 47: high temperature side insulator substrate; 51: infrared sensor; 52: p type thermoelectric conversion portion; 53: n type thermoelectric conversion portion; 54: substrate; 55: etching stop layer; 56: n type thermoelectric conversion material layer; 57: $N^+$ type ohmic contact layer; 58: insulation layer; 59: p type thermoelectric conversion material layer; 61: n side ohmic contact electrode; 62: p side ohmic contact electrode; 63: heat absorption pad; 64: absorber; 65: protective film; 66: recess.

The invention claimed is:

1. A thermoelectric conversion material composed of a compound semiconductor including a plurality of base material elements, the thermoelectric conversion material comprising:
   an amorphous phase; and
   crystal phases having an average grain size of more than or equal to 5 nm, each of the crystal phases being in a form of a grain, wherein
   the amorphous phase and the crystal phases include the plurality of base material elements,
   the plurality of base material elements include a specific base material element that causes an increase of a band gap of the crystal phases by increasing a concentration of the specific base material element,
   an atomic concentration of the specific base material element included in the crystal phases with respect to a whole of the plurality of base material elements included in the crystal phases is higher than an atomic concentration of the specific base material element included in the compound semiconductor with respect to a whole of the plurality of base material elements included in the compound semiconductor,
   a difference is more than or equal to 3 at % between the atomic concentration of the specific base material element included in the compound semiconductor with respect to the whole of the plurality of base material elements included in the compound semiconductor and the atomic concentration of the specific base material element included in the crystal phases with respect to the whole of the plurality of base material elements included in the crystal phases, and
   the compound semiconductor is a SiGe-based material.

2. The thermoelectric conversion material according to claim 1, wherein the average grain size of the crystal phases is less than or equal to 10 nm.

3. The thermoelectric conversion material according to claim 1, wherein the difference is less than or equal to 20 at % between the atomic concentration of the specific base material element included in the compound semiconductor with respect to the whole of the plurality of base material elements included in the compound semiconductor and the atomic concentration of the specific base material element included in the crystal phases with respect to the whole of the plurality of base material elements included in the crystal phases.

4. The thermoelectric conversion material according to claim 1, wherein the specific base material element is an element having a minimum lattice constant in the plurality of base material elements.

5. The thermoelectric conversion material according to claim 1, wherein a volume ratio of the crystal phases with respect to a whole of the compound semiconductor is more than or equal to 20 volume % and less than or equal to 74 volume %.

6. The thermoelectric conversion material according to claim 1, wherein the specific base material element is a group IV element.

7. The thermoelectric conversion material according to claim 1, wherein the compound semiconductor further includes at least one of a first additional element that forms an energy level in the band gap and a second additional element that brings a Fermi level close to a conduction band or a valence band.

8. The thermoelectric conversion material according to claim 7, wherein the first additional element is one or more materials selected from a group consisting of Au, Cu, and Fe.

9. The thermoelectric conversion material according to claim 7, wherein the second additional element is at least one of B and P.

10. A thermoelectric conversion element comprising:
a thermoelectric conversion material portion;
a first electrode disposed in contact with the thermoelectric conversion material portion; and
a second electrode disposed in contact with the thermoelectric conversion material portion and disposed to be separated from the first electrode, wherein
the thermoelectric conversion material portion is composed of the thermoelectric conversion material recited in claim 1 having a component composition adjusted to have p type or n type conductivity.

11. A thermoelectric conversion module comprising the thermoelectric conversion element recited in claim 10.

12. An optical sensor comprising:
an absorber that absorbs optical energy; and
a thermoelectric conversion material portion connected to the absorber, wherein
the thermoelectric conversion material portion is composed of the thermoelectric conversion material recited in claim 1 having a component composition adjusted to have p type or n type conductivity.

13. A method for manufacturing the thermoelectric conversion material recited in claim 1, the method comprising:
preparing a substrate having a main surface;
forming an amorphous phase composed of a compound semiconductor by providing a plurality of base material elements on the main surface through vapor deposition with the main surface having a temperature of less than or equal to 200 K; and
forming crystal phases in the amorphous phase by heating the amorphous phase, the crystal phases having an average grain size of more than or equal to 5 nm, each of the crystal phases being in a form of a grain.

14. The thermoelectric conversion material according to claim 1, wherein the compound semiconductor further includes a first additional element that forms an energy level in the band gap,
each of the crystal phases is a precipitated phase in which the first additional element serves as a crystal nucleus, and
the crystal phases are dispersed in the amorphous phase.

15. The thermoelectric conversion material according to claim 1, wherein the thermoelectric conversion material is produced by:
forming the amorphous phase composed of the compound semiconductor by providing the plurality of base material elements on a main surface of a substrate through vapor deposition with the main surface having a temperature of less than or equal to 200K, and
forming the crystal phases in the amorphous phase by heating the amorphous phase,
wherein crystal phases are precipitated from the amorphous phase.

* * * * *